United States Patent
Schlösser et al.

(10) Patent No.: US 6,438,022 B2
(45) Date of Patent: Aug. 20, 2002

(54) MEMORY CELL CONFIGURATION

(75) Inventors: Till Schlösser, München; Wolfgang Krautschneider, Hamburg; Franz Hofmann; Thomas-Peter Haneder, both of München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/854,259

(22) Filed: May 10, 2001

Related U.S. Application Data

(63) Continuation of application No. PCT/DE99/03044, filed on Sep. 23, 1999.

(30) Foreign Application Priority Data

Nov. 10, 1998  (DE) .......................................... 198 51 866

(51) Int. Cl.$^7$ ................................................ G11C 11/22
(52) U.S. Cl. ..................................... 365/145; 365/149
(58) Field of Search .................................. 365/145, 149

(56) References Cited

U.S. PATENT DOCUMENTS

| | | | |
|---|---|---|---|
| 5,300,799 A | | 4/1994 | Nakamura et al. |
| 5,345,415 A | | 9/1994 | Nakao et al. |
| 5,517,445 A | * | 5/1996 | Imai et al. .................. 365/145 |
| 5,689,456 A | | 11/1997 | Kobayashi |
| 5,708,284 A | | 1/1998 | Onishi |
| 5,753,946 A | | 5/1998 | Naiki et al. |
| 6,046,929 A | * | 4/2000 | Aoki et al. ................. 365/145 |

FOREIGN PATENT DOCUMENTS

| | | |
|---|---|---|
| EP | 0 516 031 A1 | 12/1992 |
| JP | 05342850 | 12/1993 |
| JP | 08097386 | 12/1996 |
| JP | 11135737 | 5/1999 |

OTHER PUBLICATIONS

Katoh Y. et al.: "Non–Volatile FCG (Ferroelectric–Capacitator and Transistor–Gate Connection) Memory Cell with Non–Destructive Read–Out Operation"; 1996 Symposium on VLSI Technology Digest of Technical Papers, IEEE, pp. 56–57, 0-7803-3342-X.

Sze, S.M. (AT&T Bell Laboratories): "Semiconductor Devices—Physics and Technology", John Wiley & Sons 1985, p. 490, ISBN 0-471-87424-8.

Lee, H.N. et al.: "Fabrication of Metal–Ferroelectric–Insulator–Semiconductor Field Effect Transistor (MEFISFET) Using Pt–SrBi$_2$Ta$_2$O$_9$–Y$_2$O$_3$Si Structure", Extended Abstracts of the 1997 International Conference on Solid State Devices and Materials, Hamamatsu, 1997, pp. 382–383.

* cited by examiner

Primary Examiner—Richard Elms
Assistant Examiner—VanThu Nguyen
(74) Attorney, Agent, or Firm—Laurence A. Greenberg; Werner H. Stemer; Gregory L. Mayback

(57) ABSTRACT

The memory cells of a memory cell configuration each have a selection transistor, a memory transistor and a ferroelectric capacitor. The selection transistor and the memory transistor are connected in series. The ferroelectric capacitor is connected between a control electrode of the memory transistor and a first terminal of the selection transistor.

7 Claims, 1 Drawing Sheet

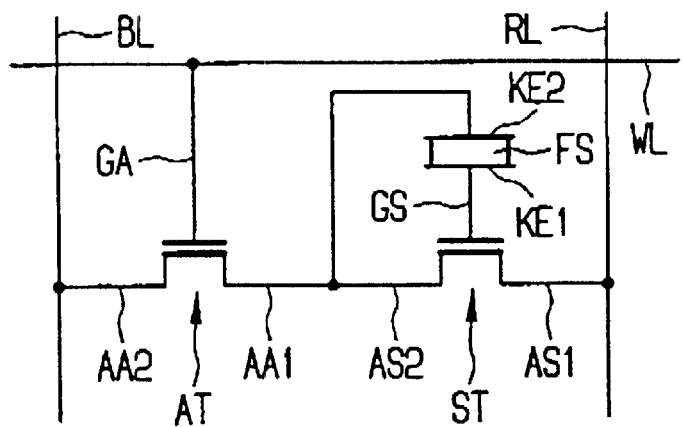
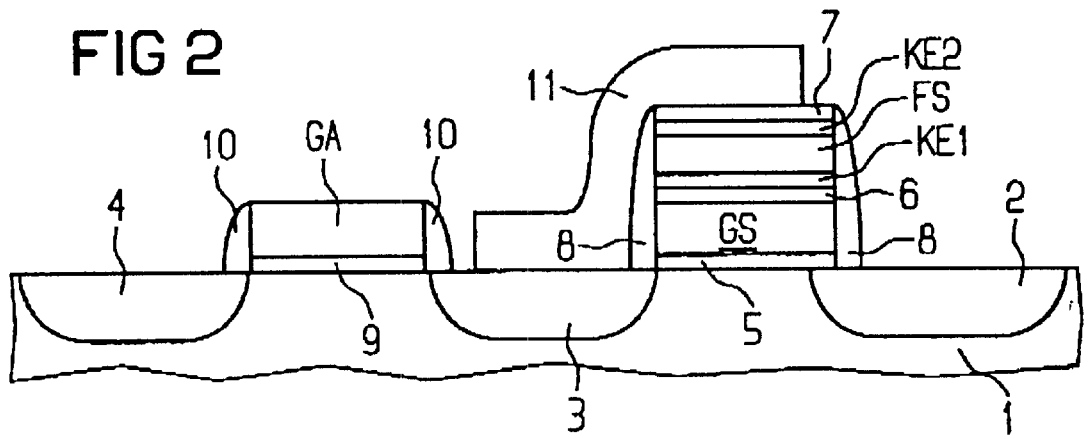
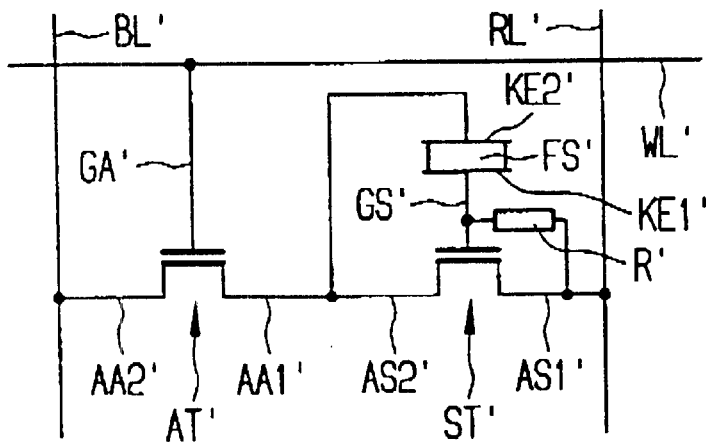

MEMORY CELL CONFIGURATION

CROSS-REFERENCE TO RELATED APPLICATION

This application is a continuation of copending International Application No. PCT/DE99/03044, filed Sep. 23, 1999, which designated the United States.

BACKGROUND OF THE INVENTION

Field of the Invention

The invention relates to a memory cell configuration for the nonvolatile storage of data.

For the nonvolatile storage of data, memory cell configurations are often used in which the memory cell in each case contains a conventional MOS transistor which has a floating gate in addition to a control gate. Charges corresponding to information to be stored are stored on the floating gate (see the reference by S. M Sze, titled "Semiconductor Devices", J. Wiley 1985, page 490). Memory cells of this type are also referred to as EEPROM cells. They can be electrically programmed. However, time constants of up to 20 ms are required for writing data. These memories can be reprogrammed only to a limited extent, that is to say about $10^6$ cycles. Furthermore, memory cells are known (see the reference by H. N. Lee et al, Ext. Abstr. Int. Conf. Solid State Devices and Materials, 1997, pages 382 to 383) in which memory cells each having a ferroelectric field-effect transistor are provided for the nonvolatile storage of data. Like a MOS transistor, the ferroelectric transistor has a source, a drain, a gate dielectric and a gate electrode, the gate dielectric containing a ferroelectric layer. The ferroelectric layer can assume two different polarization states, which are assigned to the logic values of a digital information item. By applying a sufficiently high voltage, the polarization state of the ferroelectric layer is altered. When the ferroelectric transistor is integrated in a silicon process technology, a dielectric intermediate layer is introduced between the surface of a silicon substrate and the ferroelectric layer, the intermediate layer ensuring the interface properties.

When the memory cell is programmed, part of the voltage applied between the silicon substrate and the gate electrode is dropped across the intermediate layer.

In order to avoid the technological difficulties of the interfaces, it has been proposed (see the reference by Y. Katoh et al., Symp. VLSI Technol., 1996, pages 56 to 57) to use, as a memory cell, a MOS transistor whose gate electrode is connected in series with a ferroelectric capacitor. In the memory cell, a voltage dependent on the polarization state of the ferroelectric layer of the ferroelectric capacitor is present at the gate electrode. In the memory cell, it is necessary that the connection between the gate electrode and the ferroelectric capacitor does not allow a charge flow, since otherwise the stored information is lost and the time for data retention does not suffice for nonvolatile storage.

SUMMARY OF THE INVENTION

It is accordingly an object of the invention to provide a memory cell configuration which overcomes the above-mentioned disadvantages of the prior art devices of this general type, which is suitable for the nonvolatile storage of data and which can be reprogrammed more often than EEPROM configurations and in which the time for data retention is independent of leakage currents.

With the foregoing and other objects in view there is provided, in accordance with the invention, a memory cell configuration. The memory cell configuration has a semiconductor substrate, and a multiplicity of memory cells each having a selection transistor with a terminal, a memory transistor with a control electrode, and a ferroelectric capacitor disposed in an integrated manner in the semiconductor substrate. The selection transistor and the memory transistor are connected in series through the terminal of the selection transistor. The ferroelectric capacitor is connected between the terminal of the selection transistor and the control electrode of the memory transistor.

The memory cell configuration has a multiplicity of memory cells each having a selection transistor, a memory transistor and a ferroelectric capacitor in an integrated manner in a semiconductor substrate. The selection transistor and the memory transistor are connected in series. The ferroelectric capacitor is connected between a first terminal of the selection transistor, which is connected to a second terminal of the memory transistor, and a control electrode of the memory transistor.

The memory cell can be addressed in each case via a word line via which the selection transistor is switched on. If the selection transistor is switched on, then the potential present at the selection transistor is present directly at the memory transistor and at the ferroelectric capacitor. Depending on the polarization of the ferroelectric layer of the ferroelectric capacitor, the memory transistor is then switched on or not switched on. The level of the signal that is to be detected depends on the level that is present at the selection transistor. The memory cell is thus constructed in the manner of a gain memory cell.

The information is stored in the form of the polarization of the ferroelectric layer. The polarization can be switched over as often as desired. If a memory cell is selected by driving of the corresponding word line, then a fixed potential is present at the ferroelectric capacitor via the selection transistor. In accordance with the polarization of the ferroelectric layer, a voltage dependent on the stored information is present at the gate electrode of the storage capacitor. On the other hand, if the memory cell is not selected, then the potential can relax into equilibrium via possible leakage currents via the first terminal of the selection transistor. The information is not lost in the process. Only via the opening of the selection transistor is a defined potential once again applied to the ferroelectric capacitor and a voltage is once again present at the memory transistor.

Preferably, MOS transistors are in each case used for the selection transistor and the memory transistor. The control electrode of the memory transistor is then a gate electrode. The selection transistor is connected to a word line via its gate electrode. The selection transistor and the memory transistor are connected in series between a bit line and a reference line. The reference line and the bit line run parallel. The fact of whether one of these lines is used as a bit line or as a reference line is defined by the circuitry.

The ferroelectric capacitor has a ferroelectric layer disposed between two capacitor electrodes.

In order to write information to the memory cell, an increased voltage is applied between the bit line and the reference line, so that the polarization of the ferroelectric layer is altered. In this case, it is advantageous for the ratio of the capacitances of the ferroelectric capacitor and of the gate electrode of the memory transistor to be set essentially to 1:1. Since the dielectric constant of the ferroelectric layer (for example SBT=strontium bismuth tantalate) of the ferroelectric capacitor relative to the dielectric layer of the transistor (for example $SiO_2$ in the standard silicon process technology) is approximately in a ratio of 100 to 1, in the event of an identical area of capacitor and transistor gate, a voltage divider with very unfavorable conditions is obtained. Preferably, however, the area proportions of the two components should be as small as possible and thus approximately identical. There are a number of possibilities for nevertheless improving the capacitance ratio of the voltage divider. The dielectric constant of the ferroelectric layer can be reduced by a suitable choice of the deposition conditions, for example a lower temperature budget, or by adding small quantities of niobium in the case of SBT. The capacitance of the ferroelectric capacitor decreases as a result.

On the other hand, it is possible in the region of the transistor to increase the gate capacitance by using, for example, $CeO_2$, $ZrO_2$ or a very thin nitrided silicon oxide as the gate dielectric for the transistor. The effect that can be achieved as a result is that the gate capacitance of the transistor considerably increases (for example by a factor of 5 for $CeO_2$) in comparison with conventional $SiO_2$ given a comparable layer thickness.

Furthermore, the capacitances can be suitably coordinated with one another by the layer thickness of the ferroelectric layer of the ferroelectric capacitor being, for example, a factor of 50 greater than that of the dielectric layer of the transistor.

In order to increase the capacitance between the gate electrode and the channel region of the memory transistor, it is advantageous to configure one of the source/drain regions of the memory transistor in such a way that it overlaps the gate electrode of the memory transistor. In this case, the overlap between the first source/drain region and the gate electrode of the memory transistor amounts to at least 10% of the area of the gate electrode.

Preferably, the memory transistor is connected to the reference line via a first terminal and a resistor is connected between the gate electrode of the memory transistor and the reference line. In the configuration, the read operation and the read/write memory write operation are separated in the time scale. In order to read the information, the memory cell is selected and a voltage is present at the gate electrode of the memory transistor for a time that depends on the resistor and the capacitance of the ferroelectric capacitor. The information can be read out during this time. After the time has elapsed the voltage is present directly at the ferroelectric capacitor, with the result that the polarization of the ferroelectric layer can be altered. Any resistor is suitable as the resistor in the configuration. It may have an ohmic characteristic curve. However, resistors without an ohmic characteristic curve are also suitable. In particular, the resistor can be realized by a thin dielectric layer through which charge carriers flow by tunneling. Such resistors are also referred to as tunnel resistor. In the configuration, the reference line is connected to zero volts and the bit line is connected to a supply voltage. The time constant is adjustable by way of the resistor and the capacitance.

A suitable semiconductor substrate is, in particular, a substrate that contains monocrystalline silicon, in particular a monocrystalline silicon wafer, an silicon on insulator (SOI) substrate or a SiC substrate.

Strontium bismuth tantalate (SBT), lead zirconium titanate (PZT), lithium niobate ($LiNbO_3$) or barium strontium titanate (BST) can be used, inter alia, for the ferroelectric layer of the ferroelectric capacitor.

In accordance with another feature of the invention, the memory transistor has a terminal and a source/drain region connected to the terminal of the memory transistor and the source/drain region overlaps the control electrode of the memory transistor.

In accordance with a further feature of the invention, the overlapping between the source/drain region and the control electrode of the memory transistor amounts to at least 10% of an area of the control electrode.

Other features which are considered as characteristic for the invention are set forth in the appended claims.

Although the invention is illustrated and described herein as embodied in a memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a memory cell having a selection transistor, a memory transistor and a ferroelectric capacitor according to the invention;

FIG. 2 is a diagrammatic, sectional view of a technological embodiment of the memory cell illustrated in FIG. 1; and FIG. 3 is a circuit diagram of the memory cell having the selection transistor, the memory transistor, the ferroelectric capacitor and a resistor.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a first terminal AS1 of a memory transistor ST connected to a reference line RL. A second terminal AS2 of the memory transistor ST is connected to a first terminal AA1 of a selection transistor AT. A second terminal of the selection transistor AA2 is connected to a bit line BL. A gate electrode GA of the selection transistor AT is connected to a word line WL. A gate electrode GS of the memory transistor ST is connected to a first capacitor electrode KE1 of a ferroelectric capacitor. The ferroelectric capacitor contains, in addition to the first capacitor electrode KE1, a ferroelectric layer FS and a second capacitor electrode KE2, which is connected to the first terminal AA1 of the selection transistor AT.

In order to operate the memory cell formed from the selection transistor AT, the memory transistor ST and the ferroelectric capacitor, in order to read data, a voltage is applied between the bit line BL and the reference line RL. The selection transistor AT is switched on via the word line WL. As a result, the potential present on the bit line is present at the second terminal AS2 of the memory transistor ST and at the second capacitor electrode KE2. The potential present at the gate electrode GS of the memory transistor ST depends on the polarization of the ferroelectric layer FS. In order to read out the information which is to be assigned to the polarization of the ferroelectric layer FS, an evaluation is carried out to determine whether or not a current flows between the bit line BL and the reference line RL. In order to read information, the following levels are applied to the bit line BL, the reference line RL and the word line WL: reference line RL: $V_{dd}$ or O, bit line BL: O or $V_{dd}$, word line WL: $V_{dd}+V_t$. In this case, $V_{dd}$ is the supply voltage and $V_t$ is a threshold voltage of the selection transistor AT. The increase of the voltage present on the word line by $V_t$ is generally referred to as a boost.

In order to store information in the memory cell, a higher voltage is applied between the bit line BL and the reference line RL, so that a voltage which suffices to change the direction of polarization of the ferroelectric layer FS is present across the ferroelectric capacitor with the selection transistor AT switched on.

In order to store information in the memory cell, the following levels are applied: the bit line BL: O or $V_{dd}$, the reference line RL: 2 $V_{dd}$ or $-V_{dd}$, the word line WL: $V_{dd}$ or $V_{dd}+V_t$. In this case, it is assumed that the capacitance of the ferroelectric capacitor is, for example, 5 fF/$\mu^2$ and the capacitance of the gate electrode GS of the memory transistor is, for example, 5 fF/$\mu m^2$.

In order to be able to apply a negative voltage to the reference line RL, regions 2 (see FIG. 2) connected to the reference line RL must be situated within a well to which a negative voltage is applied, which is approximately equal to the negative voltage on the reference line RL. The well is composed of a semiconductor material with a doping type that is opposite to the doping type of the first source/drain region 2. In the case of the n-channel MOS technology that is predominant for memory cells, the first source/drain region 2 is of the n-type and the well is then doped by the p-type.

Another possibility for achieving the required reversal of the electric field over the ferroelectric material during the programming of the logic states consists in applying a voltage of 2 $V_{dd}$ or 0 V to the reference line and 0 or 2 $V_{dd}$ to the bit line. Therefore, in the case of a voltage of 2 $V_{dd}$ on the bit line, the gate oxide of the selection transistor AT must be embodied with a thickness which is configured for a voltage 2 $V_{dd}+V_t$ on the word line WL, in order that the voltage 2 $V_{dd}$ can be switched through from the bit line to the ferroelectric capacitor. $V_t$ designates the threshold voltage of the selection transistor AT.

The memory cell is realized in a semiconductor substrate 1 made of monocrystalline silicon (see FIG. 2). A first source/drain region 2, a common source/drain region 3, and a second source/drain region 4 are provided in a semiconductor substrate 1. Between the first source/drain region 2 and the common source/drain region 3, a first gate oxide 5 and the gate electrode GS of the memory transistor ST are disposed on a surface of the semiconductor substrate 1. The gate oxide 5 has a thickness of 4 to 12 nm. The gate electrode GS of the memory transistor ST contains n-doped polysilicon having a dopant concentration of >$10^{20}$ cm$^{-3}$ and a thickness of 100 to 300 nm. Disposed on the surface of the gate electrode GS is a first barrier layer 6 made, for example, of TiN with a thickness of 10 to 50 nm, on which is disposed the first capacitor electrode KE1 made of platinum with a thickness of 20 to 200 nm. The first capacitor electrode KE1 adjoins the ferroelectric layer FS made of strontium bismuth tantalate (SBT) or lead zirconium titanate (PZT), which has a thickness of 20 to 200 nm. The second capacitor electrode KE2 made of platinum with a thickness of 20 to 200 nm is disposed on that side of the ferroelectric layer FS which is remote from the first capacitor electrode KE1. The second capacitor electrode KE2 is provided with a second barrier layer 7 made of TiN with a thickness of 10 to 50 nm.

The first gate oxide 5, the gate electrode GS of the memory transistor ST, the first barrier layer 6, the first capacitor electrode KE1, the ferroelectric layer FS, the second capacitor electrode KE2 and the second barrier layer 7 have common sidewalls which are provided with insulating spacers 8 made of SiO$_2$.

Between the common source/drain region 3 and the second source/drain region 4, a second gate oxide 9 with a thickness of 4 to 12 nm and the gate electrode GA of the selection transistor AT are disposed on the surface of the semiconductor substrate 1. The gate electrode GA of the selection transistor AT and the second gate oxide 9 have common sidewalls which are provided with insulating spacers 10 made of SiO$_2$.

A conductive connection 11 made of doped polysilicon reaches from the surface of the common source/drain region 3 as far as the surface of the second barrier layer 7. The second capacitor electrode KE2 and the common source/drain region 3 are electrically connected to one another via the conductive connection 11.

In the switched-off state of the selection transistor AT, a potential present at the second capacitor electrode KE2 can relax via the common source/drain region 3. When the selection transistor AT is switched on, the common source/drain region 3 is once again pulled to the potential predetermined by the bit line BL. Therefore, the information in the memory cell is not lost, even if a charge flow via leakage currents occurs via the connection between the gate electrode GS of the memory transistor ST and the first capacitor electrode KE1.

In a further exemplary embodiment shown in FIG. 3, a memory transistor ST' and a selection transistor AT' are connected in series between a reference line RL' and a bit line BL'. In this case, a first terminal AS1' of the memory transistor ST' is connected to the reference line RL', a second terminal AS2' of the memory transistor ST' is connected to a first terminal AA1' of the selection transistor AT' and a second terminal AA2' of the selection transistor AT' is connected to the bit line BL'. The gate electrode GA' of the selection transistor AT' is connected to a word line WL'.

The memory cell furthermore has a ferroelectric capacitor containing a first capacitor electrode KE1', a ferroelectric layer FS' and a second capacitor electrode KE2'. The first capacitor electrode KE1' is connected to a gate electrode GS' of the memory transistor ST'. The second capacitor electrode KE2' is connected to the first terminal AA1' of the selection transistor AT'. A resistor R', which has a resistance R, is connected between the gate electrode GS' of the memory transistor ST' and the first terminal AS1' of the memory transistor ST'.

During the operation of the memory cell, the memory cell is selected via the word line WL' and the gate electrode GA' of the selection transistor AT'. As a result of the selection transistor AT' being switched on, the voltage applied between the word line WL' and the reference line RL' is present between the first terminal AS1' and the second terminal AS2' of the memory transistor ST'. In this case, a supply voltage VDD of 1.5 to 3.3 V is applied to the bit line BL' and 0 volts is applied to the reference line RL'.

During a time of approximately RC, where R is the resistance of the resistor R' and C is the capacitance of 1 to 3 fF, a voltage which depends on the supply voltage VDD at the second terminal AS2' of the memory transistor ST' and the polarization of the ferroelectric layer FS' is present at the gate electrode GS' of the memory transistor ST'. After a longer time, surface charges of the ferroelectric layer FS' flow away via the resistor R', so that the supply voltage is dropped across the ferroelectric capacitor. Therefore, in the case of times which are longer than RC, there is present across the ferroelectric capacitor a voltage which is used for writing, that is to say for altering the polarization of the ferroelectric layer FS'.

The time constant RC is 10 to 50 ns.

We claim:

1. A memory cell configuration, comprising:

a semiconductor substrate; and a multiplicity of memory cells each having a selection transistor with a terminal, a memory transistor with a control electrode, and a ferroelectric capacitor disposed in an integrated manner in said semiconductor substrate, said selection transistor and said memory transistor connected in series through said terminal of said selection transistor, said ferroelectric capacitor connected between said terminal of said selection transistor and said control electrode of said memory transistor.

2. The memory cell configuration according to claim 1, including:

a word line, said selection transistor has a gate electrode connected to said word line, and said selection transistor and said memory transistor are MOS transistors;

a reference line; and a bit line, said selection transistor and said memory transistor are connected in series between said bit line and said reference line.

3. The memory cell configuration according to claim 2, wherein said memory transistor has a terminal connected to said reference line, and including a resistor connected between said control electrode of said memory transistor and said reference line.

4. The memory cell configuration according to claim 3, wherein said ferroelectric capacitor has a first electrode, a ferroelectric layer and a second electrode, said ferroelectric layer contains a material selected from the group consisting of strontium bismuth tantalate, lead zirconium titanate, lithium niobate and barium strontium titanate.

5. The memory cell-configuration according to claim 1, wherein said memory transistor has a terminal and a source/drain region connected to said terminal of said memory transistor and overlapping said control electrode of said memory transistor.

6. The memory cell configuration according to claim 5, wherein said overlapping between said source/drain region and said control electrode of said memory transistor amounts to at least 10% of an area of said control electrode.

7. The memory cell configuration according to claim 1, wherein said ferroelectric capacitor and said control electrode of said memory transistor have substantially equivalent capacitances.

* * * * *